United States Patent
Schaaf et al.

(10) Patent No.: US 8,267,386 B2
(45) Date of Patent: Sep. 18, 2012

(54) PNEUMATICALLY ACTUATED AREA VACUUM GRIPPER

(75) Inventors: Walter Schaaf, Freudenstadt-Gruental (DE); Thomas Eisele, Fluorn-Winzeln (DE); Rolf Guenther, Glatten (DE); Tobias Stahl, Dornstetten (DE)

(73) Assignee: J. Schmalz GmbH, Glatten (DE)

( * ) Notice: Subject to any disclaimer, the term of this patent is extended or adjusted under 35 U.S.C. 154(b) by 607 days.

(21) Appl. No.: 12/509,407

(22) Filed: Jul. 24, 2009

(65) Prior Publication Data

US 2010/0025905 A1     Feb. 4, 2010

(30) Foreign Application Priority Data

Jul. 30, 2008  (DE) .................... 20 2008 010 424 U

(51) Int. Cl.
| | |
|---|---|
| *B25B 11/00* | (2006.01) |
| *B25B 1/00* | (2006.01) |
| *B25B 3/00* | (2006.01) |
| *B25B 1/22* | (2006.01) |
| *B25B 7/00* | (2006.01) |
| *B23P 19/00* | (2006.01) |
| *A47G 21/10* | (2006.01) |
| *B25J 15/06* | (2006.01) |
| *B25J 15/02* | (2006.01) |

(52) U.S. Cl. ................ 269/21; 269/20; 269/75; 29/740; 294/2; 294/186; 294/198

(58) Field of Classification Search .................... 269/21, 269/20, 75; 294/2, 65, 186, 188, 198; 29/740
See application file for complete search history.

(56) References Cited

U.S. PATENT DOCUMENTS

| | | | |
|---|---|---|---|
| 4,252,497 A |   | 2/1981 | Burt |
| 4,362,461 A | * | 12/1982 | Cathers ..................... 198/370.12 |
| 4,470,585 A | * | 9/1984 | Bavelloni ........................ 269/21 |
| 4,492,504 A | * | 1/1985 | Hainsworth .................... 414/273 |
| 4,699,559 A | * | 10/1987 | Bibbo et al. ................... 198/428 |
| 4,753,564 A | * | 6/1988 | Pearce et al. .................. 414/796 |
| 4,878,798 A | * | 11/1989 | Johansson ..................... 414/280 |

(Continued)

FOREIGN PATENT DOCUMENTS

DE        19812275        9/1999

(Continued)

OTHER PUBLICATIONS

Search Report EP 09008235.

*Primary Examiner* — Lee D Wilson
*Assistant Examiner* — Alvin Grant
(74) *Attorney, Agent, or Firm* — Brinks Hofer Gilson & Lione

(57) ABSTRACT

A pneumatically actuated area vacuum gripper for gripping and, if necessary, separating workpieces is provided by the present disclosure. In particular, the vacuum gripper is used with thin, flexible workpieces, and has a suction chamber, which has a suction wall with perforations, to be placed on the workpiece. An ejector nozzle has a connection and an outlet, the ejection nozzle being connected to the suction chamber via its connection, and the outlet of the ejector nozzle opening to the outside or into an exhaust air duct, and the suction inlet of the ejector nozzle empties into the suction chamber, whereby the direction of the air stream in the connection coming from the suction chamber corresponds to the direction of the main air conveyance in the ejector nozzle.

6 Claims, 1 Drawing Sheet

U.S. PATENT DOCUMENTS

| | | | | |
|---|---|---|---|---|
| 5,961,168 A | * | 10/1999 | Kanno | 294/185 |
| 6,039,530 A | * | 3/2000 | Schmalz et al. | 414/627 |
| 6,068,547 A | * | 5/2000 | Lupi | 451/388 |
| 6,155,795 A | * | 12/2000 | Schmalz et al. | 417/151 |
| 6,382,692 B1 | * | 5/2002 | Schmalz et al. | 294/189 |
| 6,502,877 B2 | * | 1/2003 | Schick et al. | 294/65 |
| 6,547,228 B1 | * | 4/2003 | Schmalz et al. | 269/21 |
| 6,817,639 B2 | * | 11/2004 | Schmalz et al. | 294/185 |
| 7,416,176 B2 | * | 8/2008 | Hamann | 269/266 |
| 7,661,736 B2 | * | 2/2010 | Schmalz et al. | 294/183 |
| 7,677,622 B2 | * | 3/2010 | Dunkmann et al. | 294/65 |
| 7,878,564 B2 | * | 2/2011 | Kang et al. | 294/186 |
| 2002/0033611 A1 | * | 3/2002 | Schmalz et al. | 294/64.1 |
| 2002/0056954 A1 | * | 5/2002 | Schmalz et al. | 269/21 |
| 2002/0074703 A1 | * | 6/2002 | Schmalz et al. | 269/21 |
| 2003/0164620 A1 | * | 9/2003 | Schmalz et al. | 294/64.1 |

FOREIGN PATENT DOCUMENTS

| | | |
|---|---|---|
| DE | 10216221 | 10/2003 |
| DE | 102004016637 | 10/2005 |
| DE | 102006013970 | 9/2007 |
| FR | 2166242 | 8/1973 |
| FR | 2284470 | 4/1976 |
| JP | 9002682 | 1/1997 |
| JP | 10167470 | 6/1998 |
| JP | 2007331056 | 12/2007 |

* cited by examiner

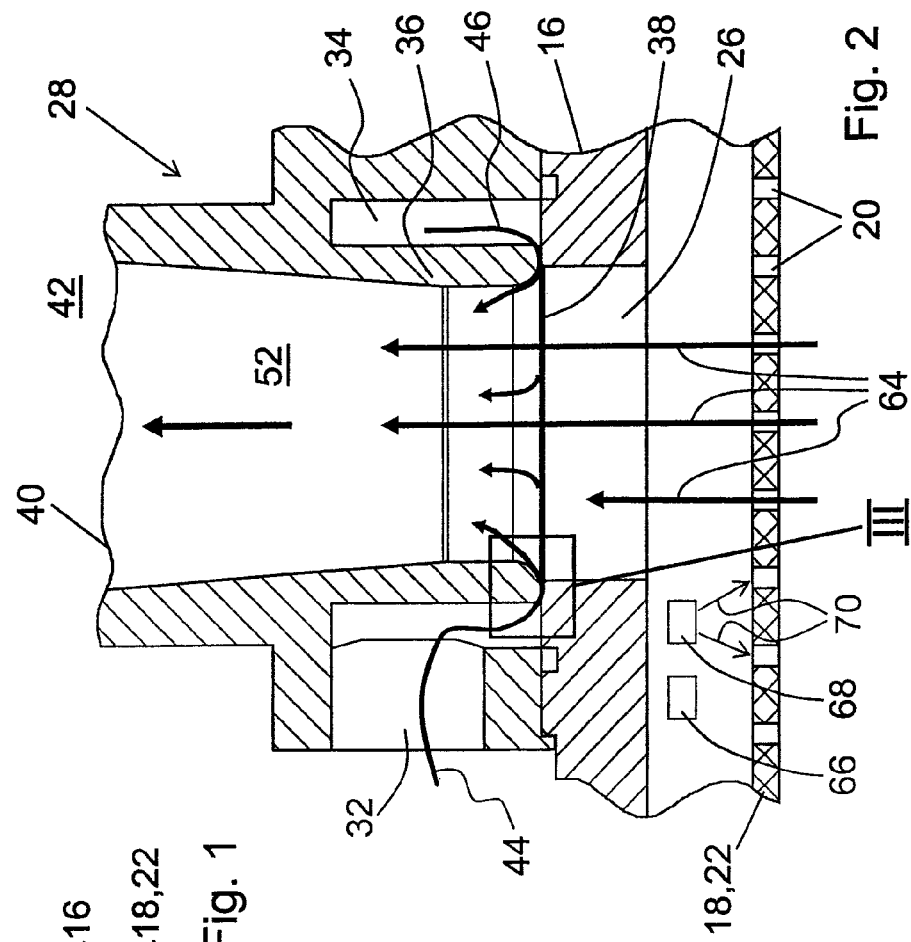
Fig. 2
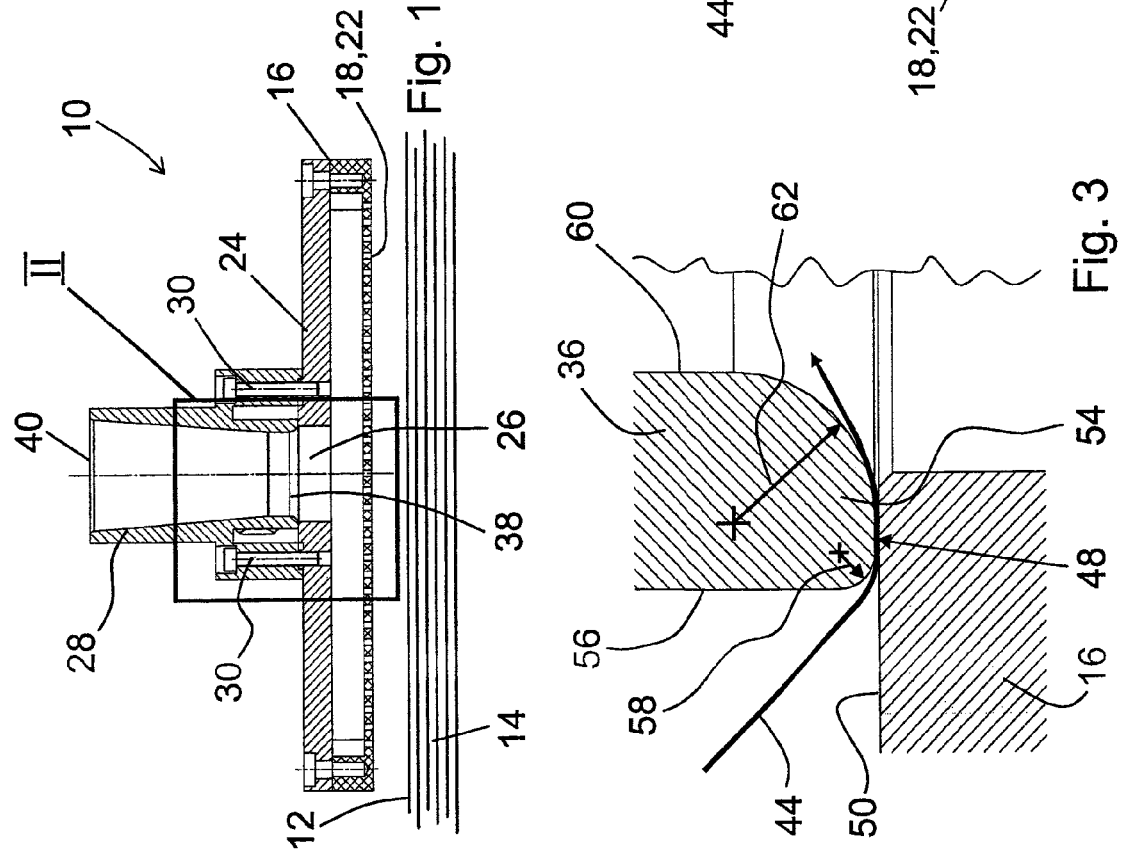
Fig. 1
Fig. 3

PNEUMATICALLY ACTUATED AREA VACUUM GRIPPER

CROSS-REFERENCE TO RELATED APPLICATIONS

This application claims the benefit of German Utility Patent Application No. DE 20 2008 010 424.6 filed Jul. 30, 2008. The disclosure of the above application is incorporated herein by reference.

FIELD

The present disclosure relates to a pneumatically actuated area vacuum gripper for gripping and, if necessary, separating workpieces, e.g. thin, flexible workpieces.

BACKGROUND

The statements in this section merely provide background information related to the present disclosure and may not constitute prior art.

A device of this type is, for example, known from DE 20 2006 016 833 U1. This known device is a Bernoulli vacuum gripper with a perforated plate into which compressed air is blown via a compressed air duct, and the compressed air leaves the gripper via a large surface in the direction of the workpiece. Although vacuum grippers of this type have the advantage that objects can be suctioned with them, the objects may not be excessively heavy.

SUMMARY

The present disclosure provides an area vacuum gripper with which large-area objects may be suctioned more efficiently, e.g. more reliably, more defined regarding the position, in a more process-safe or energy-efficient manner.

According to the present disclosure, this is achieved in one form with an area vacuum gripper of the type mentioned above, having a suction chamber that has a suction wall with perforations to be placed on the workpiece. Moreover, an ejector nozzle is connected to the suction chamber, whereby the outlet of the ejector nozzle opening empties to the outside or into an exhaust air duct and the suction inlet of the ejector nozzle in the suction chamber.

With the area vacuum gripper according to the present disclosure, the suction pressure is generated by operating an ejector nozzle with the compressed air. This ejector nozzle thus has an outlet, a suction inlet, as well as a compressed air inlet. A suction chamber is connected to the suction inlet so that there where the work piece abuts, air is suctioned, whereby the workpiece is held firmly, in contrast to the device according to DE 20 2006 016 833 U1, in which air is blown in the direction of the workpiece. This way, wafers, foils, paper, i.e. thin and also flexible objects, may be gripped carefully and separated. The workpieces virtually jump toward the area vacuum gripper and are separated as a result of the suction effect.

In one form, the direction of the main air conveyance of the suction air stream in the connection of the ejector nozzle to the suction chamber matches the direction of the main air conveyance of the propulsion air stream in the ejector nozzle. As the suction air stream in the ejector nozzle is not deviated, it receives a high speed pulse. This results from the fact that the propulsion air stream in the connection of the ejector nozzle to the suction chamber is introduced into the main duct of the ejector nozzle where it joins the suction air stream.

In another form of the present disclosure, it is provided that the suction chamber has an outlet opening. According to the present disclosure, it is provided on the side opposite the suction wall. The outlet opening may be formed as a bore, the suction wall, for example, being formed by a perforated steel plate.

The outlet opening of the suction chamber according to the present disclosure is connected to the suction inlet of the ejector nozzle. In particular, both openings are aligned and in coaxial position to one another in one form of the present disclosure.

The suction inlet of the ejector nozzle in one form is formed by the opening of a sleeve-shaped section of the ejector nozzle. The front side of the sleeve-shaped section is arranged spaced apart from the surface of the suction chamber. Thus, there is a ring-shaped duct between the opening of the sleeve-shaped section of the ejector nozzle and the suction chamber. The ring-shaped duct ends in the sleeve-shaped section of the ejector nozzle as well as the outlet opening of the suction chamber.

As already mentioned, the sleeve-shaped section of the ejector nozzle according to the present disclosure is surrounded by a ring-shaped duct into which the compressed air inlet also opens, the ring-shaped duct being open in the direction of the suction chamber. The compressed air flows around the sleeve-shaped section in the ring-shaped duct and enters the sleeve-shaped section between its front side and the suction chamber, discharging via its outlet. Suction pressure is thus generated via which air is suctioned from the suction chamber.

Moreover, the ring-shaped duct is closed off from the environment. This means that air is exclusively suctioned via the suction chamber.

The front side of the sleeve-shaped section in the area of the outer peripheral surface in one form is shaped such that it has a smaller transition radius than in the area of the inner peripheral surface, where it has a larger transition radius. Thus, when the compressed air enters the sleeve-shaped section, it is directed such that it flows in the direction of the outlet.

In another form of the present disclosure, it is provided that the annular gap between the surface of the suction chamber and the front side of the sleeve-shaped section of the ejector nozzle widens radially inward. This widening has a speed-reducing effect, which favors the redirection of the compressed air stream in the direction of the outlet.

Another form of the present disclosure provides that the free cross-section of the sleeve-shaped section of the ejector nozzle widens conically in the direction of the outlet. In addition, the speed of the compressed air stream is thus reduced, which increases the suction effect in the area of the free end of the sleeve-shaped section of the ejector nozzle.

Generally, it can be stated that a utility air stream is generated with the ejector nozzle via whose core air is carried away, resulting in a suction air stream being generated in the suction chamber.

An additional development provides that a vacuum sensor for monitoring the load of the suction wall is especially arranged in the suction chamber. A slight vacuum points to a lacking or insufficient load of the suction wall, whereas major vacuum indicates an optimal loading of the suction wall.

Alternatively or additionally, an optical sensor may be provided in the suction chamber. The load of the suction chamber may likewise be monitored by means of this optical sensor, which may also be used for determining the workpiece position, i.e. positioning the workpiece.

Further advantages, features, and details of the present disclosure will be apparent from the subclaims, as well as from the following description, and are explained in detail with reference to an especially preferred exemplary embodiment in the drawing. The characteristics illustrated in the drawing, as well as in the description and the features mentioned in the claims, can each be fundamental to the present disclosure as such or in any combination thereof.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 1: A longitudinal section of a preferred embodiment of an area vacuum gripper;

FIG. 2: An enlarged reproduction of detail II according to FIG. 1; and

FIG. 3: An enlarged reproduction of detail III according to FIG. 2.

The drawings described herein are for illustration purposes only and are not intended to limit the scope of the present disclosure in any way.

DETAILED DESCRIPTION

The following description is merely exemplary in nature and is not intended to limit the present disclosure, application, or uses.

FIG. 1 schematically shows a longitudinal section of an area vacuum gripper overall designated with 10 by means of which a workpiece 12 may be gripped and lifted. Several of these workpieces 12 may be lying on top of one another and form a stack 14 so that the topmost workpiece may be lifted each time. The area vacuum gripper 10 has a suction chamber 16 which, with its bottom side that forms the suction wall 18, may be placed on the workpiece 12. The placing and lifting device of the area vacuum gripper 10, e.g. a robot arm or the like, is not shown.

The suction wall 18 has perforations 20 (FIG. 2) and is, for example, configured as a perforated plate 22, in particular, as a perforated steel plate. On the side 24 opposite the suction wall 18, i.e. the upper side, the suction chamber 16 has an outlet opening 26, which coaxially connects to the ejector nozzle 28. The ejector nozzle 28 is, for example, connected to the suction chamber 16 by means of screws 30.

FIG. 2 shows an enlarged reproduction of detail II according to FIG. 1, where the connection of the ejector nozzle 28 to the suction chamber 16 is visible. The ejector nozzle 28 is provided with a compressed air inlet 32, which ends in a ring-shaped duct 34 provided in the ejector nozzle 28. This ring-shaped duct 34 surrounds a sleeve-shaped section 36, which is arranged coaxially to the outlet opening 26 of the suction chamber 16. The free end 54 of the sleeve-shaped section 36 defines a suction inlet 38, whereas the opposite end is formed by an outlet 40, which opens to the outside 42, i.e. opens to the environment. The clear cross-section of the sleeve-shaped section 36 widens between the suction inlet 38 and the outlet 40.

Furthermore, the arrows 44 and 46 in FIG. 2 indicate how compressed air flows into the ring-shaped duct 34 via the compressed air inlet 32, flowing around the free end 54 of the sleeve-shaped section 36 and entering the suction inlet 38.

This is made possible because the free end 54 of the sleeve-shaped section 36, as shown in FIG. 3, has a clearance 48 from the upper side 50 of the suction chamber 16, so that the compressed air between the sleeve-shaped section 36 and the upper side 50 of the suction chamber 16 may enter the suction duct 52 of the sleeve-shaped section 36. The free end 54 of the sleeve-shaped section 36 has a small radius 58 in the area of the outer peripheral surface 56 and a large radius 62 in the area of the inner peripheral surface 60. The clearance 48, in particular the ring-shaped gap between the free end 54 and the upper side 50 of the suction chamber 16, enlarges in the direction of the suction duct 52.

If, as indicated with arrow 44, compressed air flows into the ring-shaped duct 34 via the compressed air inlet, this compressed air will distribute evenly over the periphery of the sleeve-shaped section 36 and circulate through the ring-shaped gap formed by the clearance 48, entering the suction duct 52 as a ring-shaped or sleeve-shaped utility air stream, whereby its flow is directed toward the outlet 40. As a result, air is carried away from the suction chamber 16 in the core of this ring-shaped stream, which is indicated with the arrows 64. This air enters the suction chamber 16 via the perforations 20, whereby the workpiece 12 is suctioned toward the suction wall 18.

According to the present disclosure, a vacuum sensor 66 is provided in the suction chamber 16 that captures the suction pressure inside the suction chamber 16. Thus, the degree of loading of the suction wall 18 may be determined. An optical sensor 68 is also arranged inside the suction chamber 16 that monitors the load of the perforations 20, which is indicated with the arrows 70. The load may, likewise, be checked this way, which, however, also allows the determining of the position, i.e. the position of the workpiece 12 at the area vacuum gripper 10.

By means of the area vacuum gripper 10 according to the present disclosure, a workpiece 12 may be gripped and lifted in an easy and safe manner.

It should be noted that the disclosure is not limited to the embodiments described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A pneumatically actuated area vacuum gripper for gripping and, if applicable, separating workpieces, in particular, thin, flexible workpieces, with a suction chamber attachable on the workpiece, comprising a suction wall, an ejector nozzle comprising a connection and an outlet, wherein the ejector nozzle is connected to the suction chamber by said connection, and the outlet of the ejector nozzle opens to the outside or into an exhaust air duct, and a suction inlet of the ejector nozzle situated in the connection empties into the suction chamber, wherein the direction of an air stream in the connection coming from the suction chamber corresponds to the direction of the main air conveyance stream in the ejector nozzle, characterized in that the suction wall comprises perforations, and that the ejector nozzle comprises a sleeve-shaped section with a free end, wherein the free end comprises a curved or inclined surface that is curved or inclined in the direction of the main air conveyance stream, and the suction chamber comprises an upper side, wherein an annular clearance is formed between the free end and the upper side of the suction chamber, whereby a propulsion air or utility air enters the ejector nozzle outside the suction chamber and upon entry into the space in the ejector nozzle delimiting the main conveyance air stream follows the curved or inclined surface, wherein the propulsion air or utility air enters the ejector nozzle and the space in the ejector nozzle delimiting the main conveyance air stream via the annular clearance, and in that the workpiece rests against the suction wall of the suction chamber constituting the bottom side.

2. The area vacuum gripper according to claim 1, characterized in that the air stream coming from the suction chamber is not redirected after the connection in the ejector nozzle.

3. The area vacuum gripper according to claim 2, characterized in that the curved or inclined surface is formed by a radius rotating about an axis.

4. The area vacuum gripper according to claim 1, characterized in that the outlet opening of the suction chamber is connected to the suction inlet of the ejector nozzle and, in particular, arranged coaxially to it.

5. The area vacuum gripper according to claim 1, characterized in that a sensor, e.g. a flow sensor, a vacuum sensor for monitoring the load of the suction wall, and/or an optical sensor for monitoring the load and/or determining the position of the workpiece is, in particular, provided in the suction chamber or at the suction space.

6. The area vacuum gripper according to claim 1, characterized in that the suction plate is formed by a perforated plate and/or is fastened in an exchangeable manner to the suction chamber.

* * * * *